United States Patent [19]
Huang et al.

[11] Patent Number: 6,077,769
[45] Date of Patent: Jun. 20, 2000

[54] METHOD OF FABRICATING A DAUL DAMASCENE STRUCTURE

[75] Inventors: Yimin Huang, Taichung Hsien; Tony Lin, Kao Hsiung Hsien; Tri-Rung Yew, Hsinchu Hsien, all of Taiwan

[73] Assignee: United Microelectronics Corp., Hsinchu, Taiwan

[21] Appl. No.: 09/072,311

[22] Filed: May 4, 1998

[30] Foreign Application Priority Data

Feb. 26, 1998 [TW] Taiwan .................................. 87102773

[51] Int. Cl.$^7$ .............................................. H01L 21/4763
[52] U.S. Cl. ........................ 438/622; 438/624; 438/634; 438/637; 438/638; 438/669; 438/671
[58] Field of Search ................................ 438/622, 624, 438/634, 637, 638, 669, 671

[56] References Cited

U.S. PATENT DOCUMENTS

| | | | |
|---|---|---|---|
| 4,764,484 | 8/1988 | Mo ............................................. | 437/203 |
| 5,635,423 | 6/1997 | Huang et al. ............................. | 437/195 |
| 5,877,076 | 3/1999 | Dai ........................................... | 438/597 |
| 5,882,996 | 3/1999 | Dai ........................................... | 438/597 |
| 5,926,732 | 7/1999 | Matsuura .................................. | 438/622 |

*Primary Examiner*—John F. Niebling
*Assistant Examiner*—Lynne A. Gurley

[57] ABSTRACT

A method is provided for fabricating a dual damascene structure on a substrate with a first dielectric layer, an etching stop layer, a second dielectric layer, and a hard mask layer formed on it. The first step is to define the hard mask layer in order to form the first hole, which corresponds to the position of the conductive layer exposing the second dielectric layer. Then, an etching process, including an etching step with medium $SiO_2$/SiN etching selectivity and an over-etching step with high $SiO_2$/SiN etching selectivity, is performed to form the second hole and the third hole. Finally, a glue/barrier layer and a metal layer are filled into the second hole and the third hole, thus accomplishing a dual damascene structure.

26 Claims, 5 Drawing Sheets

METHOD OF FABRICATING A DAUL DAMASCENE STRUCTURE

CROSS-REFERENCE TO RELATED APPLICATION

This application claims the priority benefit of Taiwan application serial no. 87102773, filed Feb. 26, 1998, the full disclosure of which is incorporated herein by reference.

BACKGROUND OF THE INVENTION

1. Field of the Invention

The present invention relates to a method of fabricating multilevel interconnects of semiconductor devices, and more particularly, to a method of fabricating a dual damascene structure.

2. Description of Related Art

Due to the higher and higher integration of semiconductor devices within integrated circuits (IC), there is not enough area to place and fabricate the needed interconnects. In accordance with the need for an increased number on interconnects on downsized metal oxide semiconductor (MOS) transistors, it has become necessary to include two or more metal layers in IC fabrication design. Usually, the metal layers are separated with inter-metal dielectric (IMD), wherein the conducting lines for connecting two separated metal layers is a so-called 'via plug'.

There are two conventional methods of fabricating via holes and interconnects. The first method includes two steps: forming a dielectric layer on the top of a metal layer, followed by defining, a photoresist layer on the top the dielectric layer, then finishing up a via by etching; and forming a via plug by depositing conducting material into the via, defining a metal layer after depositing the metal layer, then, finally, depositing the IMD. The second method applies the technique of a dual damascene structure to form via holes and inter-connects simultaneously. However, the conventional dual damascene structure technique results in smaller via areas, or furthermore the loss of material from the silicon nitride (SiN) layer, because of the comparatively large deviation of the etching critical dimension. Therefore, the present invention is to overcome the drawback of conventional dual damascene structure technique.

FIGS. 1A through 1F show a conventional fabricating technique for a dual damascene structure in sequence. As shown in FIG. 1A, the MOS device, the substrate 10, is not shown completely, the conductive region 12 can be used as either a drain or a source within a transistor, a metal layer within a gate structure, or a metal layer within an interconnect. First, IMD layer 14 is formed on the substrate and then etching stop layer 16 is formed over IMD layer 14. IMD layer 14 can be, for example, $SiO_2$, and etching stop layer 16 can be, for example, silicon nitride with a thickness of about 1000 to 2000 Å. Then, a predetermined photoresist layer 18 is formed on etching stop layer 16. The region for forming the via hole is now defined on the photoresist 18.

Next, in FIG. 1B, the photoresist 18 serves as a mask, through which a dry etching is performed on the SiN, forming a hole 17 in the etching stop layer 16a to expose the dielectric layer 14. The photoresist 18 is then removed.

In FIG. 1C, another layer of IMD 24 is formed above the substrate 10. Then, as shown in FIG. 1D, a predetermined photoresist 28 is formed on the top of IMD layer 24 to expose the regions intended to be interconnects. Referring to FIG. 1E, after the high $SiO_2/SiN$ etching selectivity dry etching is performed on the desired regions of the IMD layer (the IMD 24, as shown in FIG. 1D) by using the photoresist 28 as the ask, two interconnect holes 25 and 35 are formed, and a via hole 15 is formed in IMD layer 14a as well. Part of the etching stop layer 16b and part of the conductive region 12 are also both exposed.

An etching process of a very high $SiO_2/SiN$ etching selectivity is employed in the conventional method in order to prevent a short between the interconnect and the underlying conductive layer due to etching through. Such a short occurs because of an unstable thickness of the interconnect, occurring on the SiN layer under the interconnect hole 35 during the process of etching the via hole 15 following the etching process of interconnect holes 25 and 35. However, an etching process with a very high $SiO_2/SiN$ etching selectivity usually forms via holes lacking the desired degree of verticality, which reduces the bottom area of via hole 15 so that contact resistance is increased.

As shown in FIG. 1F, after the photoresist is removed, a glue/barrier layer 20, conforming to via hole 15, interconnect hole 25, and the sidewalls of the interconnect hole 35, is deposited in order to increase adherence between the subsequently deposited metal layer and other material. A metal layer 30 is deposited into via hole 15, interconnect hole 25 and 35, and on IMD layer 24a. The portions of metal layer 30 lying on the upper surface of IMD 24a are then removed by chemical mechanical polishing (CMP), to expose IMD 24a. This concludes the fabrication of a dual damascene structure.

The conventional dual damascene structure technique is a technique to form a via and interconnect at the same time by employing a very high $SiO_2/SiN$ etching selectivity. However, the bottom area of the via hole decreases gradually as it gets close to the conductive region, which leads to a higher contact resistance. When the depth of the via hole increases, its bottom area decreases correspondingly. If the conductive region is small as well, it is easy to make the contact resistance between the via hole and conducting region get higher.

SUMMARY OF THE INVENTION

It is therefore an objective of the present invention to provide a method of fabricating a dual damascene structure that does not require employment of an etching process with a very high $SiO_2/SiN$ etching selectivity ratio. In addition, it can make the sidewalls of via holes nearly vertical, and prevent the contact resistance from increasing due to the gradual decreasing of the bottom area of the via hole.

In accordance with the primary objective of the present invention, the method of fabricating a dual damascene structure includes: forming a first hole, which corresponds to the position of the conductive region and is used to expose the second dielectric layer; by defining a hard mask layer on a substrate which has the first dielectric layer, etching stop layer, the second dielectric layer, and a hard mask layer be formed on it; performing the reverse metal interconnect photolithography and the etching process, which comprises a step of medium SiO/SiN etching selectivity and a step of high SiO/SiN etching selectivity; forming the second and third holes by using the hard mask layer as mask; and filling the glue/barrier layer and metal layer into the second and third holes to accomplish the process of a dual damascene structure.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 2A through 2G are schematic sectional diagrams used to describe the steps involved in the method of the present invention for fabricating a dual damascene structure.

Figure 1A:
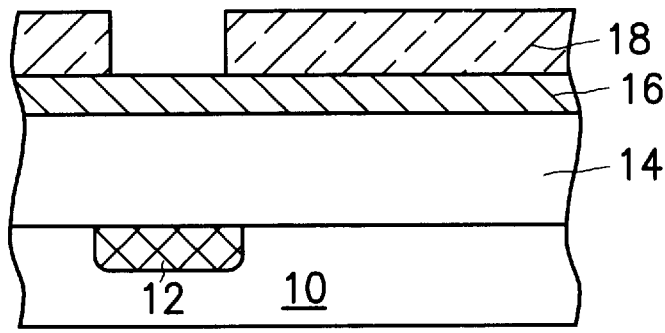
FIGS. 1A through 1F are the sectional diagrams of the conventional process of fabricating a dual damascene structure in sequence.
Figure 1B:
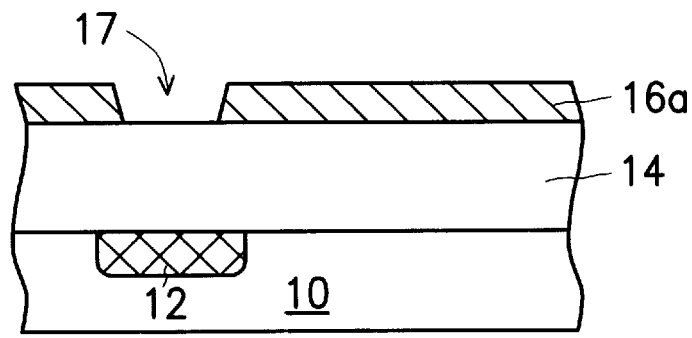
Figure 1C:
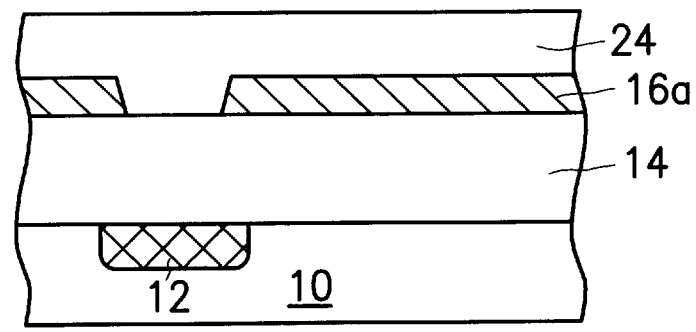
Figure 1D:
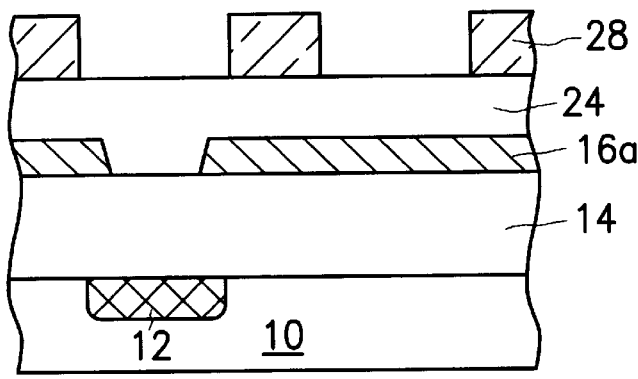
Figure 1E:
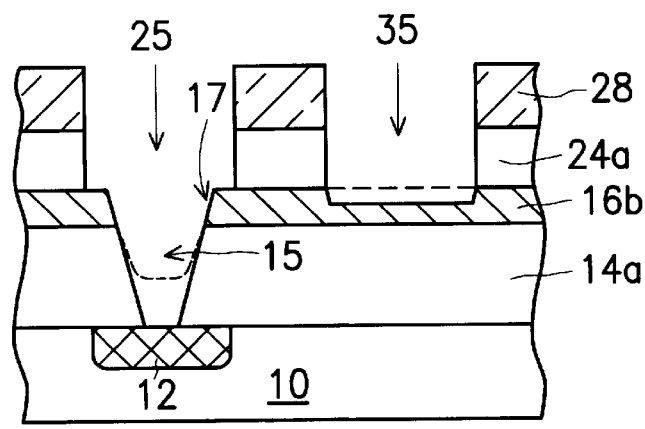
Figure 1F:
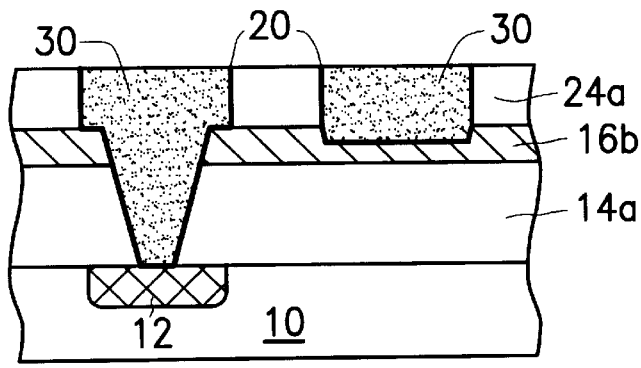
Figure 2A:
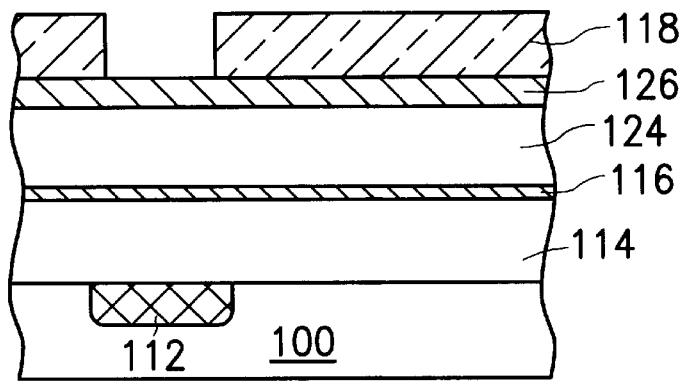
FIGS. 2A through 2G are the sequential sectional diagrams of the process of fabricating a dual damascene structure described in the preferred embodiment according to the present invention.

In FIG. 2A, the MOS device located on the substrate 100 is not completely shown. The conductive region 112 may be the drain/source of a transistor device, a metal layer or interconnect within a gate structure. First, an IMD layer 114, an etching stop layer 116, an IMD layer 124, and a hard mask layer 126 are formed on the top of the substrate 100. The material used to form the IMD layers 114 and 124 is, for example, $SiO_2$ deposited by chemical vapor deposition, to thicknesses of 8000 and 6000 Å respectively. The material used to form the etching stop layer 116 and hard mask layer 126 is, for example, SiN deposited by chemical vapor deposition, to thicknesses of 500 and 1500 Å, respectively. Next, a predefined photoresist layer 118, which defines the region for forming via holes, is formed on the top of the hard mask layer 126.

Figure 2B:
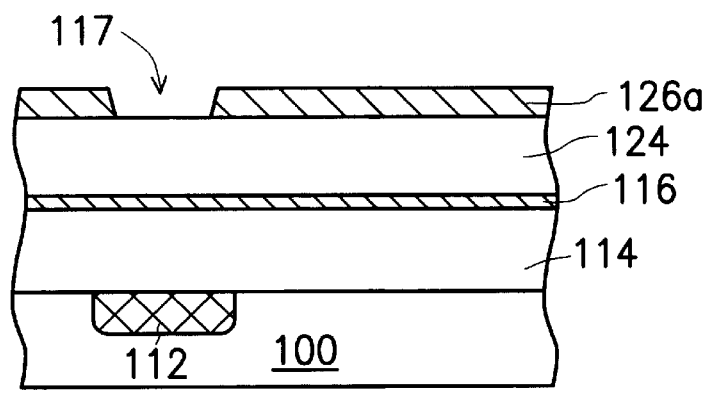

Next, referring to FIG. 2B, a hole 117 is formed in hard mask layer 126a by performing a dry etching process of a dual damascene structure. Photoresist 118 is used as a mask to expose the IMD layer beneath. Then the photoresist 118 is removed.

Figure 2C:
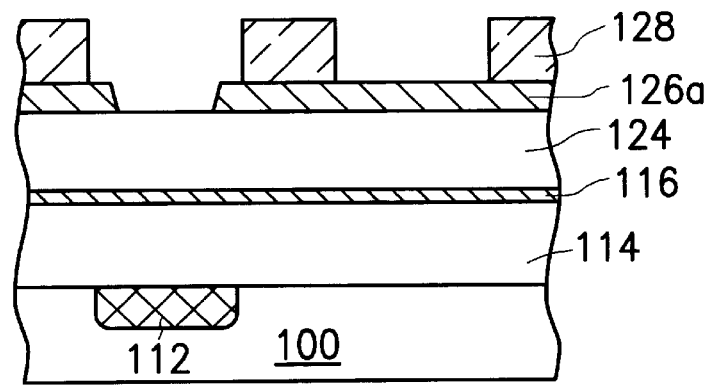

Referring to FIG. 2C, a predefined photoresist layer 128, which is used to define the region for forming metal interconnect, is formed on substrate 100.

Figure 2D:
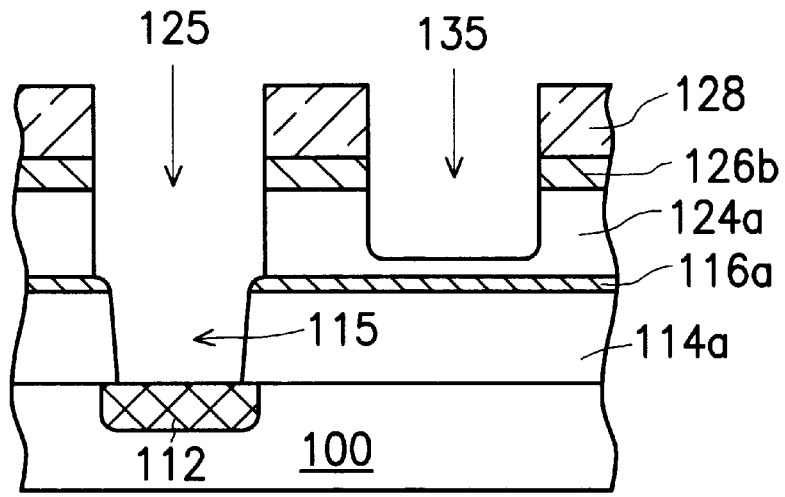

FIG. 2D is a schematic sectional diagram showing the formation of the via hole and interconnect hole during the process of etching as described in a better embodiment according to the present invention, a method for fabricating a dual damascene structure.

As shown in FIG. 2D, an etching process is performed by employing a medium $SiO_2/SiN$ etching selectivity ratio, with photoresist layer 128 serving as a mask. Because of the existence of the SiN mask, the etching rate on interconnect holes 125 and 135 is slower. The etching rate on the via hole 115 is faster as its progress is not impeded by the presence of the SiN mask. Therefore, a dual damascene structure, which has a relatively deep via hole and a relatively low interconnect trench, can be fabricated in one etching step by selecting a proper $SiO_2/SiN$ etching selectivity ratio.

For example, in the presence of a SiN mask layer 126b having a thickness of 1500 Å, a dielectric layer 124b having a thickness of 6000 Å, a etching stop layer 116b having a thickness of 500 Å, and a dielectric layer 114b having a thickness of 8000 Å, the $SiO_2/SiN$ etching selectivity is about 8, that is, [8000 Å/(1500–500) Å]=8. If the selected $SiO_2/SiN$ etching selectivity is greater than 8, interconnect hole 135 won't be able to reach the etching stop layer 116a in the time the via hole takes to reach conductive region 112. Hence, if there is a difference in the $SiO_2/SiN$ etching selectivity ratio, an over-etching process with a higher $SiO_2/SiN$ etching selectivity ratio has to be performed in order to finish the etching process and enlarge the process window. Because the via having nearly vertical sidewalls is formed before the over-etching, the over-etching (employing a higher $SiO_2/SiN$ etching selectivity ratio) won't affect the shape of the via hole.

As described before, the dual damascene structure holes of this invention have sidewalls that are almost vertical. As the via hole 115 gets deeper, its bottom area won't be reduced as in conventional methods, so the contact deviation between the via hole and the conductive region 112 can be prevented, and the deviation of the etching critical dimension can be brought down. Furthermore, because the sidewalls are almost vertical, they can prevent the etching from stopping before it reaches conductive layer, as described before.

Figure 2E:
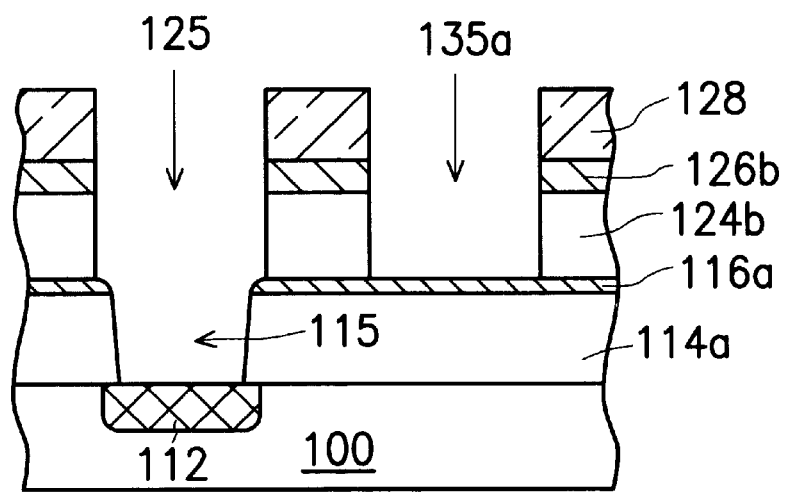

As shown in FIG. 2E, over-etching with a high $SiO_2/SiN$ etching selectivity is performed for continuous etching to reach the etching stop layer 116a. In this manner, an interconnect hole 135a is formed.

Figure 2F:
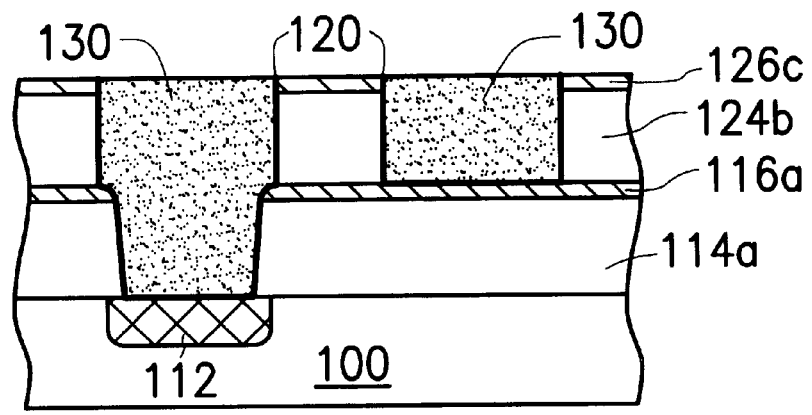

As shown in FIG. 2F, after the photoresist 128 is removed, a glue/barrier layer 120, such as a Ti/TiN layer is formed. The glue/barrier layer 120 conforms to the shape of via hole 115 and the sidewalls of interconnect hole 125 and 135a, and increases adhesion to the subsequently deposited metal layer, such as aluminum or tungsten, and other materials. Afterwards, a metal layer 130 is deposited into the holes on IMD layer 124 and 114a, and then, the hard mask layer 126c is exposed by CMP. The polishing process continues to reduce the thickness of the hard mask layer 126c. The hard mask can further protect the IMD layer 124b from polished during CMP, which eliminates the problem of thinning the interconnect layer.

The reason that a thickness of the hard mask layer is reduced as described above is to reduce the stress generated by the SiN layer, and to prevent the occurrence of parasitic capacitance due to the existence of the SiN layer between two conductive layers during the process of fabricating another layer of interconnect.

Figure 2G:
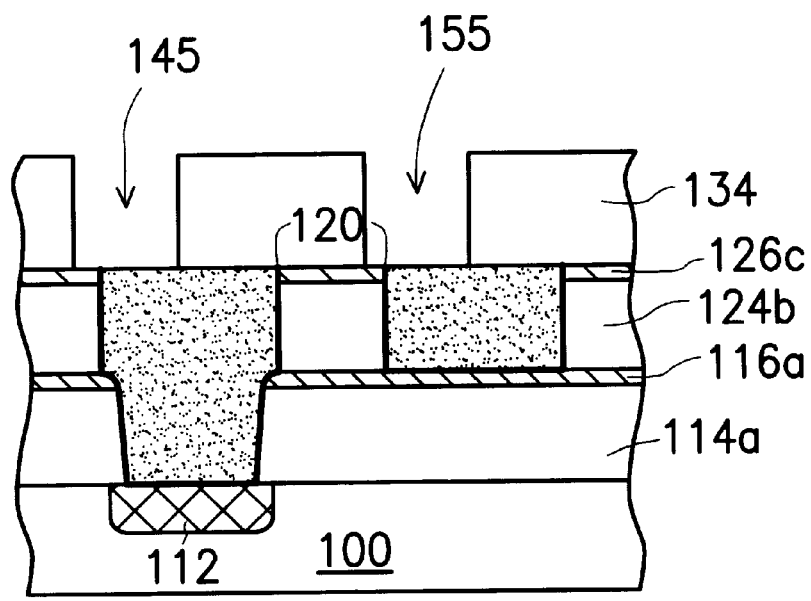

If another interconnect layer is needed, it can be made by applying a similar method. As shown in FIG. 2G, a predefined IMD layer 134, which has two interconnect holes 145 and 155, is formed on substrate 100. The process described previously can be performed by chemical vapor deposition, starting with depositing a $SiO_2$ layer, and then defining the interconnect holes 145 and 155 after performing CMP on the $SiO_2$ layer. Hard mask layer 126c can be used as an etching stop layer for the following process of forming the unlanded via. Since this portion of the process is not the one of the objectives according to the present invention, there is no further discussion about it.

From the foregoing description, it can be learned that the present invention has the following advantages:

(1) There is an additive hard mask layer 126, which can protect the etching stop layer, in the method according to the present invention, so there is no loss of SiN as in the conventional method.

(2) The etching process as described in the conventional method sometimes stops before it reaches the bottom of the via hole, or decreases the bottom area of the via hole which can lead to a larger deviation of etching critical dimension. The present invention therefore employs an etching of medium $SiO_2/SiN$ selectivity instead of the conventional etching so that the sidewalls are nearly vertical, for a smaller deviation of etching critical dimension.

(3) The hard mask can protect the IMD layer from polishing during CMP, which eliminates the problem of a thinner interconnect layer.

(4) The hard mask layer employed in the present invention can be used as an etching stop layer (i.e. the hard mask layer) for the process of forming the unlanded via. The thinned hard mask layer can not only reduce the stress generated by the SiN, but also prevent the occurrence of parasitic capacitance during the processing of another interconnect layer.

The invention has been described using exemplary preferred embodiments. However, it is to be understood that the scope of the invention is not limited to the disclosed embodiments. On the contrary, it is intended to cover various modifications and similar arrangements The scope of the claims, therefore, should be accorded the broadest interpretation so as to encompass all such modifications and similar arrangements.

What is claimed is:

1. A method for fabricating a dual damascene structure, comprising the steps of:

providing a substrate, comprising at least a conductive region;

forming a first dielectric layer, an etching stop layer, a second dielectric layer, and a hard mask layer from a top of the substrate upward in sequence;

defining the hard mask layer for forming a first hole, aligned over the conductive region for exposing the second dielectric layer;

forming a patterned photoresist layer on the hard mask layer, wherein the photoresist layer has a first opening exposing the second dielectric layer exposed by the first hole, and the photoresist layer further has a second opening exposing a portion of the hard mask layer;

performing an etching process to form a second hole aligned under the first hole to expose the conductive region, and a third hole aligned under the second opening to expose the stop layer;

filling the second and the third holes with a conductive layer; and performing a planarization process for exposing the hard mask layer.

2. The method of claim 1, wherein the conductive region comprises source/drain regions of a transistor device.

3. The method of claim 1, wherein the conductive region comprises a metal layer of a gate structure.

4. The method of claim 1, wherein the conductive region includes a metal layer of an interconnect.

5. The method of claim 1, wherein the first dielectric layer comprises a $SiO_2$ layer.

6. The method of claim 1, wherein the step of forming the first dielectric layer includes chemical vapor deposition.

7. The method of claim 1, wherein the first dielectric layer has a thickness of about 8000Å.

8. The method of claim 1, wherein the etching stop layer includes a SiN layer.

9. The method of claim 1, wherein the method of forming the etching stop layer include chemical vapor deposition.

10. The method of claim 1, wherein the etching stop layer has a thickness of about 500Å.

11. The method of claim 1, wherein the second dielectric layer includes a $SiO_2$ layer.

12. The method of claim 1, wherein methods of forming the second dielectric layer include chemical vapor deposition.

13. The method of claim 1, wherein the second dielectric layer has a thickness of about 6000Å.

14. The method of claim 1, wherein the hard mask layer includes a SiN layer.

15. The method of claim 1, wherein the method of forming the hard mask layer includes chemical vapor deposition.

16. The method of claim 1, wherein the hard mask layer has a thickness of about 1500Å.

17. The method of claim 1, wherein a glue/barrier layer, which conforms to the second hole and the third hole, is formed before the deposition of the conductive layer.

18. The method of claim 17, wherein the glue/barrier layer includes Ti/TiN, Ta, TaN, or WN.

19. The method of claim 1, wherein the conductive layer includes an aluminum layer.

20. The method of claim 1, wherein the conductive layer includes a copper layer.

21. The method of claim 1, wherein the conductive layer includes a tungsten layer.

22. The method of claim 1, wherein the etching process includes a dry etching step with medium $SiO_2$/SiN etching selectivity, and an over etching step.

23. The method of claim 21, wherein $SiO_2$/SiN etching selectivity of the over etching step is higher than that of the dry etching.

24. The method of claim 1, wherein the planarization process includes chemical mechanical polishing.

25. The method of claim 1, wherein the planarization process further includes thinning the hard mask layer.

26. A method for forming a dual damascene structure, comprising:

providing a substrate, the substrate comprising at least a conductive region;

forming a first dielectric layer on the substrate, so as to cover the conductive region;

forming an etch stop layer on the first dielectric layer;

forming a second dielectric layer on the etch stop layer;

forming a hard mask layer on the second dielectric layer, the hard mask layer having an opening aligned over the conductive region and exposing a portion of the second dielectric layer;

performing a reverse metal photolithography process and an etching process to form a first hole exposing the conductive region and a second hole exposing a part of the etch stop layer, wherein the etching process is performed in a single step with a etching selectivity that the conductive region and the portion of the etch stop layer are exposed simultaneously; and forming a conductive layer to fill the first and the second holes.

* * * * *